(12) United States Patent
Cheng et al.

(10) Patent No.: US 9,812,394 B2
(45) Date of Patent: Nov. 7, 2017

(54) FACETED STRUCTURE FORMED BY SELF-LIMITING ETCH

(71) Applicant: International Business Machines Corporation, Armonk, NY (US)

(72) Inventors: Kangguo Cheng, Schenectady, NY (US); Ali Khakifirooz, Los Altos, CA (US); Juntao Li, Cohoes, NY (US); Werner A Rausch, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 86 days.

(21) Appl. No.: 14/880,438

(22) Filed: Oct. 12, 2015

(65) Prior Publication Data
US 2017/0103947 A1    Apr. 13, 2017

(51) Int. Cl.
*H01L 27/11*    (2006.01)
*H01L 23/525*   (2006.01)
*H01L 27/06*    (2006.01)
*H01L 21/8234*  (2006.01)

(52) U.S. Cl.
CPC .. *H01L 23/5256* (2013.01); *H01L 21/823431* (2013.01); *H01L 27/0617* (2013.01)

(58) Field of Classification Search
CPC .................... H01L 27/0617; H01L 21/823431
USPC .......................................... 257/397; 438/381
See application file for complete search history.

(56) References Cited

U.S. PATENT DOCUMENTS

| | | | |
|---|---|---|---|
| 7,410,844 B2 | 8/2008 | Li | |
| 7,456,097 B1 | 11/2008 | Hill | |
| 7,696,539 B2 | 4/2010 | Li | |
| 8,053,809 B2 | 11/2011 | Cheng | |
| 8,400,813 B2 | 3/2013 | Lee | |
| 8,445,940 B2 | 5/2013 | Tsai | |
| 8,841,190 B2 | 9/2014 | Qin | |
| 9,397,096 B2 * | 7/2016 | Zhu | ................ H01L 21/823821 |
| 2006/0086977 A1 | 4/2006 | Shah | |
| 2008/0169535 A1 | 7/2008 | Butt | |
| 2008/0246059 A1 | 10/2008 | Li | |
| 2012/0187528 A1 | 7/2012 | Cheng | |

FOREIGN PATENT DOCUMENTS

WO    WO2014071650    5/2014

* cited by examiner

*Primary Examiner* — Tuan Nguyen
(74) *Attorney, Agent, or Firm* — Jeffrey S Labaw; Steven J Meyers

(57) ABSTRACT

An eFuse device on a substrate is formed on a substrate used for an integrated circuit. A semiconductor structure is created from a semiconductor layer deposited over the substrate. A mask layer is patterned over the semiconductor structure such that a first region of the semiconductor structure is exposed and a second region of the semiconductor structure is protected by the mask layer. Next, a self-limiting etch is performed on the exposed areas in the first region of the semiconductor structure, producing a first faceted region of the semiconductor structure in the first region. The semiconductor in the first faceted region has a minimum, nonzero thickness at a point where two semiconductor facet planes meet which is thinner than a thickness of semiconductor in the second region of the semiconductor structure is protected by the mask layer. The first faceted region is used as a link structure in the eFuse device.

20 Claims, 10 Drawing Sheets

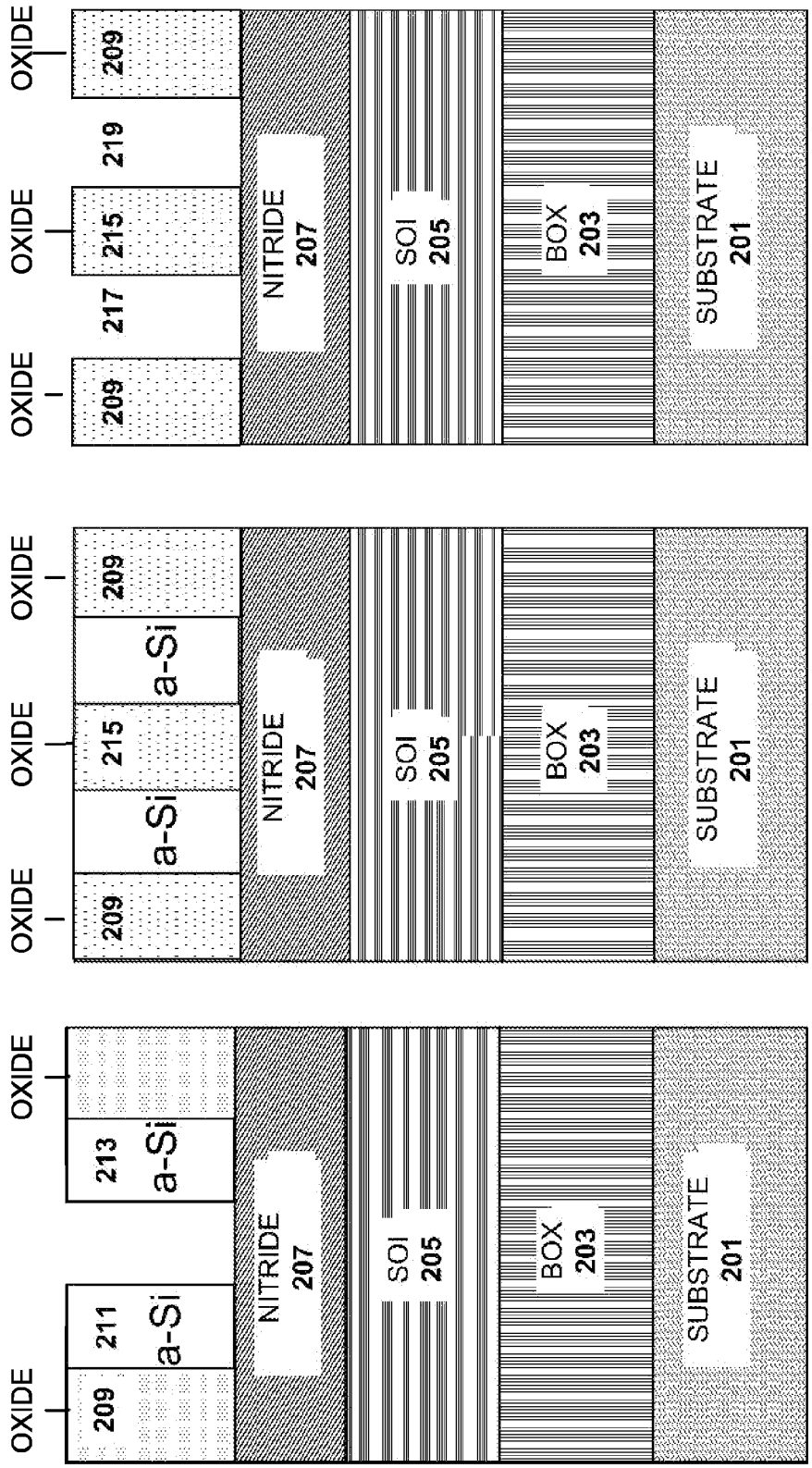

FACETED STRUCTURE FORMED BY SELF-LIMITING ETCH

BACKGROUND OF THE INVENTION

Technical Field

This disclosure relates to integrated circuit devices, and more specifically, to forming a faceted structure in an integrated circuit by a self-limiting etch.

Background of the Related Art

As the dimensions of modern integrated circuitry in semiconductor chips continue to shrink, conventional lithography is increasingly challenged to make thinner and thinner structures. Some structures within the integrated circuitry are optimally thinner than the remainder of the structures, and so, if the semiconductor processes are performing at the current limitations of the lithography for most of the structures, the processes are particularly challenged to make some selected structures thinner than the remainder of the structures.

Fuses are utilized within integrated circuit devices for a variety of purposes, such as to program certain functionality into the device or to enable or disable various devices within the circuit device. Such fuse structures can make or break electrical connections (such as in physically destroyable fuses or anti-fuses). If the fuse structure is the same thickness as other device structures, the current needed to burn the fuse out can be undesirably high and can damage other devices. However, since it is desirable to make integrated circuits at whatever the current limits of lithography may be with the prior art processes it is difficult to make the fuse structure thinner than other device features.

Thus, it is desirable to provide processes which can be used to make improved fuse structures for integrated circuitry.

BRIEF SUMMARY

According to this disclosure, an eFuse device on a substrate is formed on a substrate used for an integrated circuit. A semiconductor structure is created from a semiconductor layer deposited over the substrate. A mask layer is patterned over the semiconductor structure such that a first region of the semiconductor structure is exposed and a second region of the semiconductor structure is protected by the mask layer. Next, a self-limiting etch is performed on the exposed areas in the first region of the semiconductor structure, producing a first faceted region of the semiconductor structure in the first region. The semiconductor in the first faceted region has a minimum, nonzero thickness at a point where two semiconductor facet planes meet which is thinner than a thickness of semiconductor in the second region of the semiconductor structure is protected by the mask layer. The first faceted region is used as a link structure in the eFuse device.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which:

FIGS. 9A-9C are schematic cross-sectional diagrams of a structure according to a third embodiment of the invention;

DETAILED DESCRIPTION OF THE DRAWINGS

Figure 1:
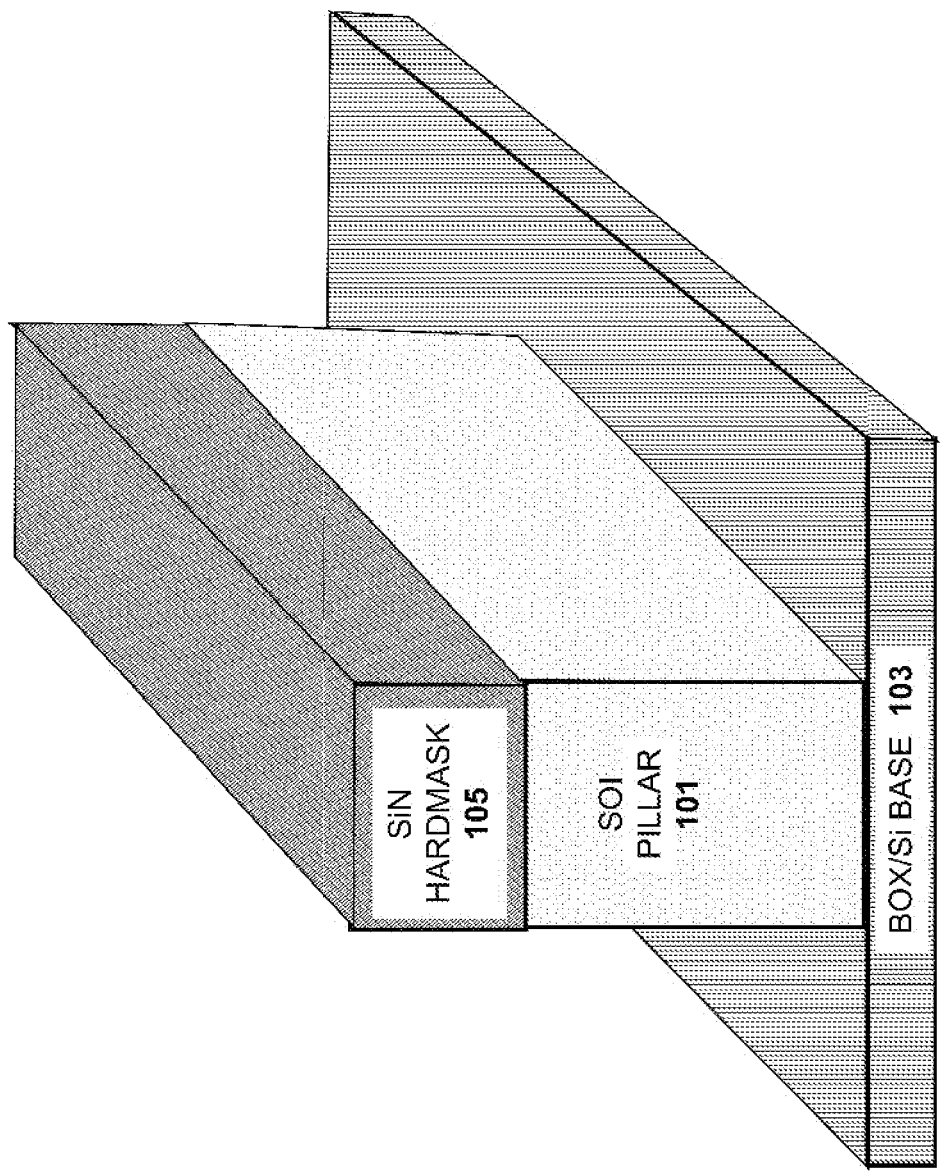
FIG. 1 is a perspective diagram of a structure according to a first embodiment of the invention.

At a high level, the invention uses a self-limiting etch to fabricate semiconductor structures such as a fuse, or an eFuse, in a masked semiconductor layer. In a first embodiment of the invention, a self-limiting anisotropic etch forms faceted semiconductor pillar sidewalls. Such a narrow link portion is difficult to form by a conventional lithography and patterning process. The vertically faceted semiconductor pillar can be used to make a variety of devices. As an example, an eFuse is presented. In a second embodiment of the invention, a combined resistance modulator and eFuse is formed. In a third embodiment, a self-limiting etch is used to fabricate a horizontally faceted structure which can be used as an eFuse. In each of the embodiments of the invention, the self-limiting etch is performed on an exposed face of the semiconductor structure while other faces are protected by the substrate or masking layers. In the embodiments, silicon is used as an exemplary semiconductor, however, other semiconductors in the III-V family can be used such as Ge or SiGe since they exhibit similar etch characteristics.

A "substrate" as used herein can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures, etc.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide that have relative dielectric constants above that of SiO2 (above 3.9). The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall structures. The sidewall structures can be used as masking structures for further semiconducting processing steps.

FIG. 1 is a perspective diagram of a structure according to a first embodiment of the invention. In this first embodiment, a vertical faceted structure is formed. In this diagram, a silicon pillar 101 is formed on substrate 103. In one preferred embodiment, Buried Oxide (BOX) is used as the substrate, however, those skilled in the art would recognize that other substrate materials can be used. In preferred embodiments of the invention, a semiconductor covered by an insulator is used as the substrate of the devices formed by the processes of the invention.

The silicon pillar 101 is formed by patterning to open a link portion of the deposited silicon while other portions of the silicon pillar 101, e.g., the top face, are protected by a mask 105. Although other lithography techniques can be used, a sidewall image transfer (SIT) technique can be used to precisely control the silicon pillar width. An SIT technique can be used to define thinner structures than conventional lithography. Both SIT and conventional photolithograpy techniques are well known to those skilled in the art. As shown in the figure, the silicon pillar has a greater length than width, though in other embodiments of the invention, the silicon pillar may be square or other shapes. The cross section of the silicon pillar can be square, or rectangle with various widths and heights. In one preferred embodiment of the invention, the purpose of the pillar is to form a link portion with smaller cross section area and two terminals with larger cross section area, so the link portion can be used a fuse.

After etch, the silicon pillar 103 has a hardmask 105 on top. In one preferred embodiment, the hardmask 105 is composed of silicon nitride, since in subsequent steps silicon nitride shows good selectivity with respect to silicon in etching steps. That is, silicon nitride protects the masked faces of the silicon from the etch while the silicon which is exposed is etched preferentially. However, those skilled in the art would recognize that alternative materials for the masking layer can be used.

Figure 2:
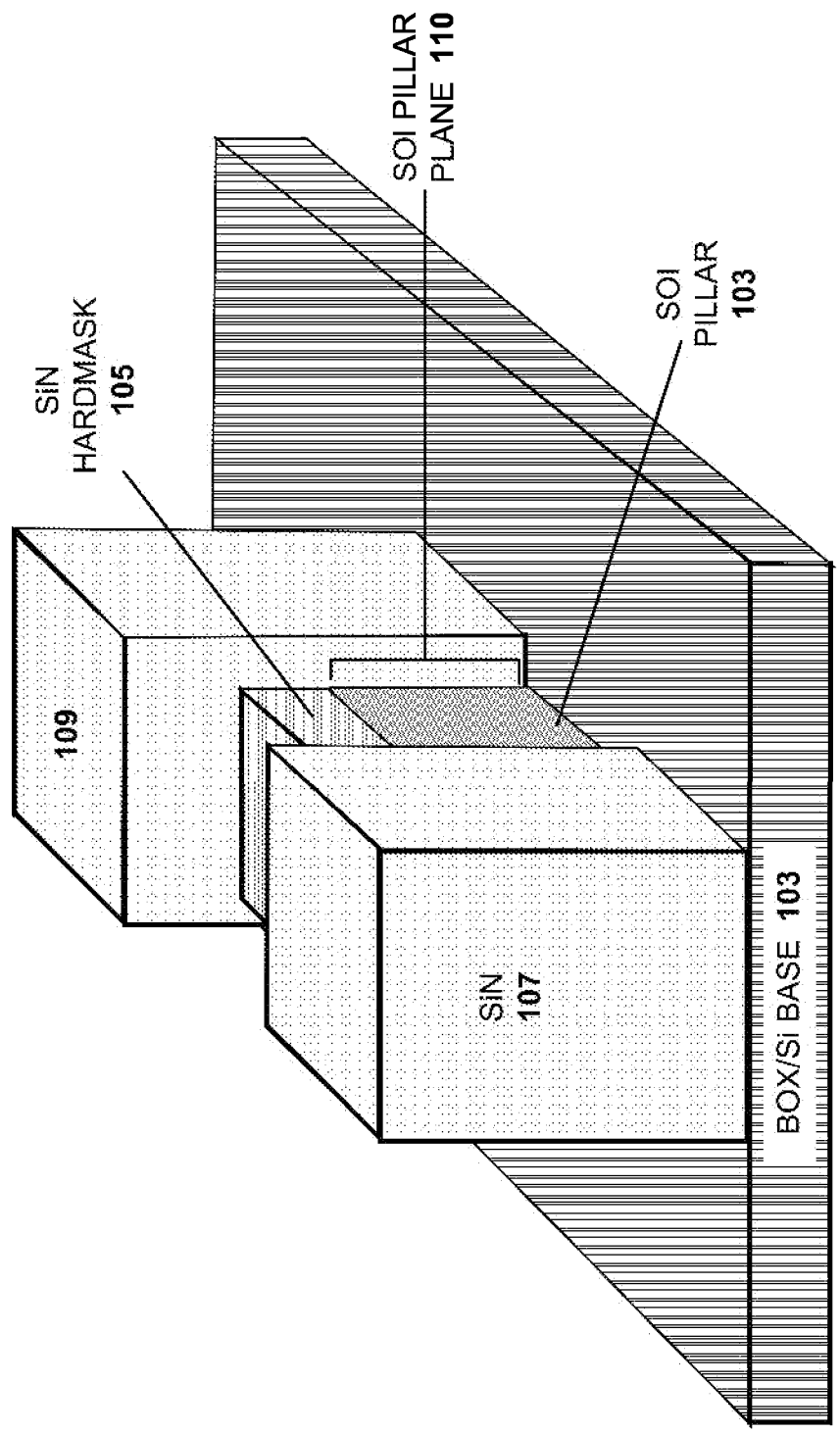
FIG. 2 is a perspective diagram of a structure according to a first embodiment of the invention.

FIG. 2 is a perspective diagram of a structure according to the first embodiment of the invention as the process continues. In this diagram, vertical silicon nitride masks 107, 109 are formed at either end of the silicon pillar 103 protecting front and back faces. The silicon pillar remains topped by the horizontal silicon nitride mask 105. The vertical silicon nitride masks 107, 109 can be formed with conventional photolithography steps. For example, a lithographic pattern could be formed in which the areas in which the silicon nitride should be deposited are exposed. The resist is developed revealing those areas. The silicon nitride layer is deposited, and the resist removed, leaving that silicon nitride in the desired areas.

In the embodiment, side face 100 and an opposite side face (not pictured) will be exposed to the etch. One skilled in the art would appreciate that in an alternative embodiment one of the exposed sides of the silicon pillar could be protected by another section of the silicon nitride mask. In this embodiment, only the single exposed side of the pillar would be etched in subsequent steps.

Figure 3:
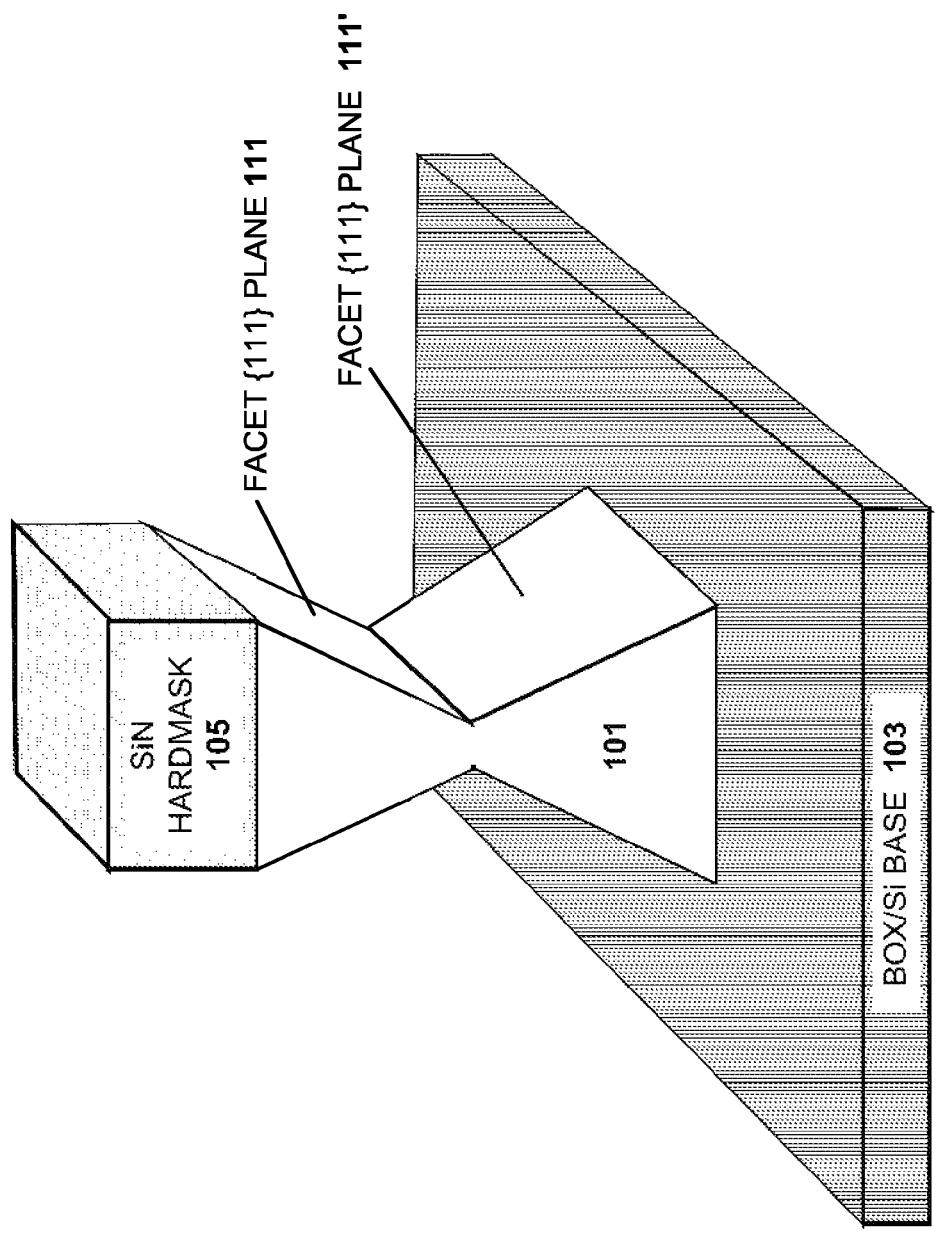
FIG. 3 is a perspective diagram of a structure according to a first embodiment of the invention.

FIG. 3 is a perspective diagram of a structure according to the first embodiment of the invention. In the drawing, the vertical SiN mask layers are omitted and only the faceted link portion is shown for clarity. As shown, an anisotropic etch has been performed, e.g., a Tetramethylammonium hydroxide (TMAH) or ammonia etch, which etches silicon pillar 101 and forms faceted crystallographic planes {111} on the silicon pillar sidewalls. Once the silicon facet planes are exposed, the anisotropic etch virtually stops, and therefore can be considered self-limiting. During this anisotropic wet etching process, different crystal planes have drastic differences in etch rate. For example, the etch rate for the {100} plane, the original silicon sidewall, is much faster (>100×) than that for {111} planes formed by the facets. So when the {111} family crystallographic planes intersect, the etch rate will drop dramatically and the planes become a self-limiting etch stop.

Figure 4:
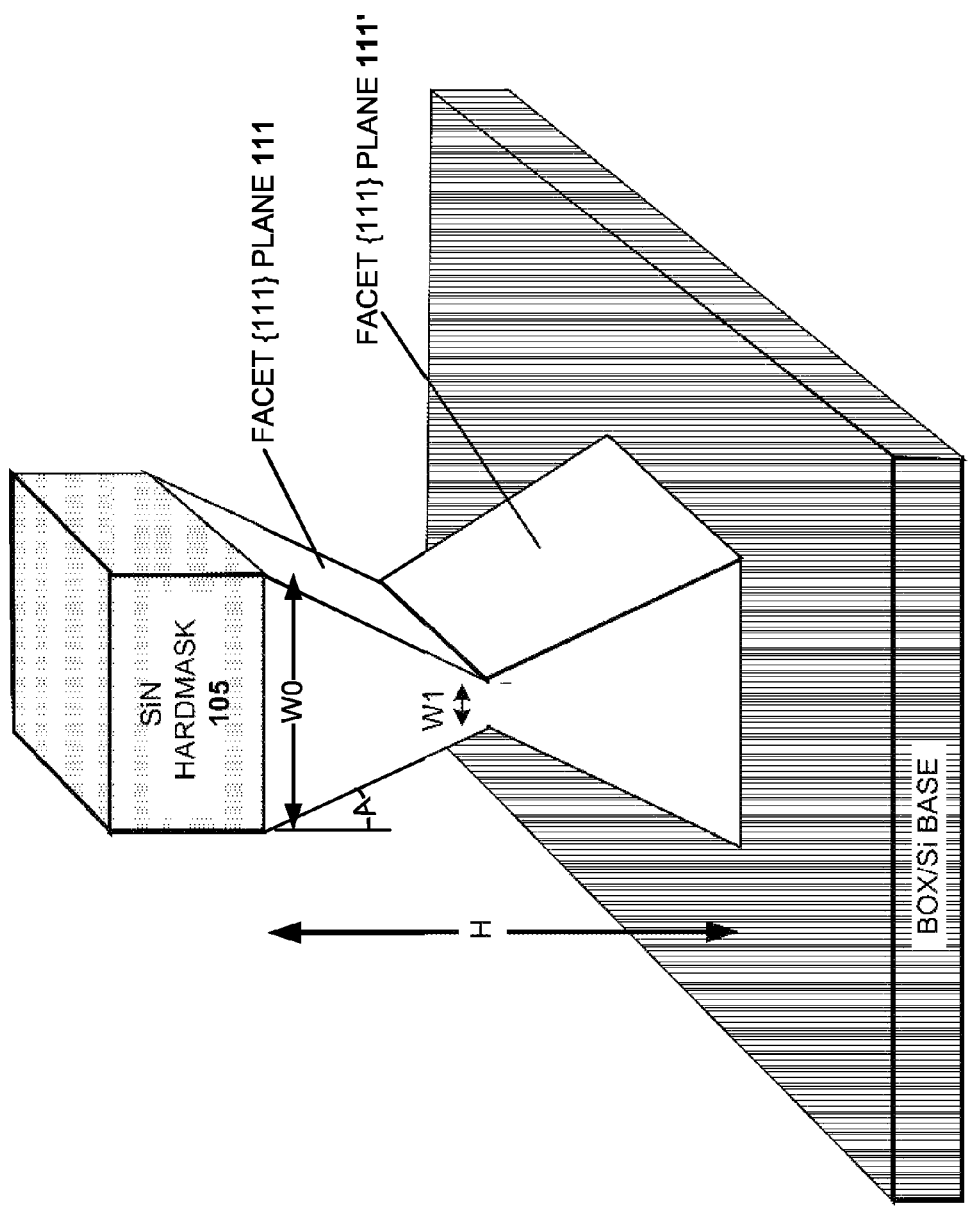
FIG. 4 is a perspective diagram of a structure according to a first embodiment of the invention.

FIG. 4 is a perspective diagram of a structure according to the first embodiment of the invention showing the relationship between the final thickness of link portion (W1), the original Silicon on Insulator (SOI) thickness (H) and pillar width (W0). The final thickness of link portion (W1) can be controlled by the original SOI thickness (H) and pillar width (W0). H is controlled by SOI process, and W0 is controlled by the sidewall image transfer (SIT) process. By controlling the SIT spacer thickness, and given that the angle (A) is precisely set for Si crystalline plane 110 (shown in FIG. 2, the vertical side face) and crystalline plane 111 (shown in FIG. 3, the facet plane) by the silicon crystalline structure, the thickness of the link portion is controlled:

E.g., A=35.3 degree between planes 111, 110

W1=W0-H*tan(a)

The crystal orientation of the final pillar is determined by the original silicon substrate crystal orientation in conjunction with the orientation of silicon pillar after patterning. For example, in FIG. 4, the angle A is 35.3 degrees after ammonia etch when the starting silicon wafer is a standard (001) wafer and silicon pillar sidewall is (110) after pillar formation, but before ammonia etch. Alternatively, in other embodiments of the invention, angle A is 54.7 degrees after ammonia etch when the starting silicon wafer is a standard (001) wafer and silicon pillar sidewall is (100) after pillar formation, but before ammonia etch. Thus, in preferred embodiments of the invention, the orientation of the crystalline structure of the wafer and the silicon layer deposited on the insulator layer is ascertained prior to patterning.

Figure 5:
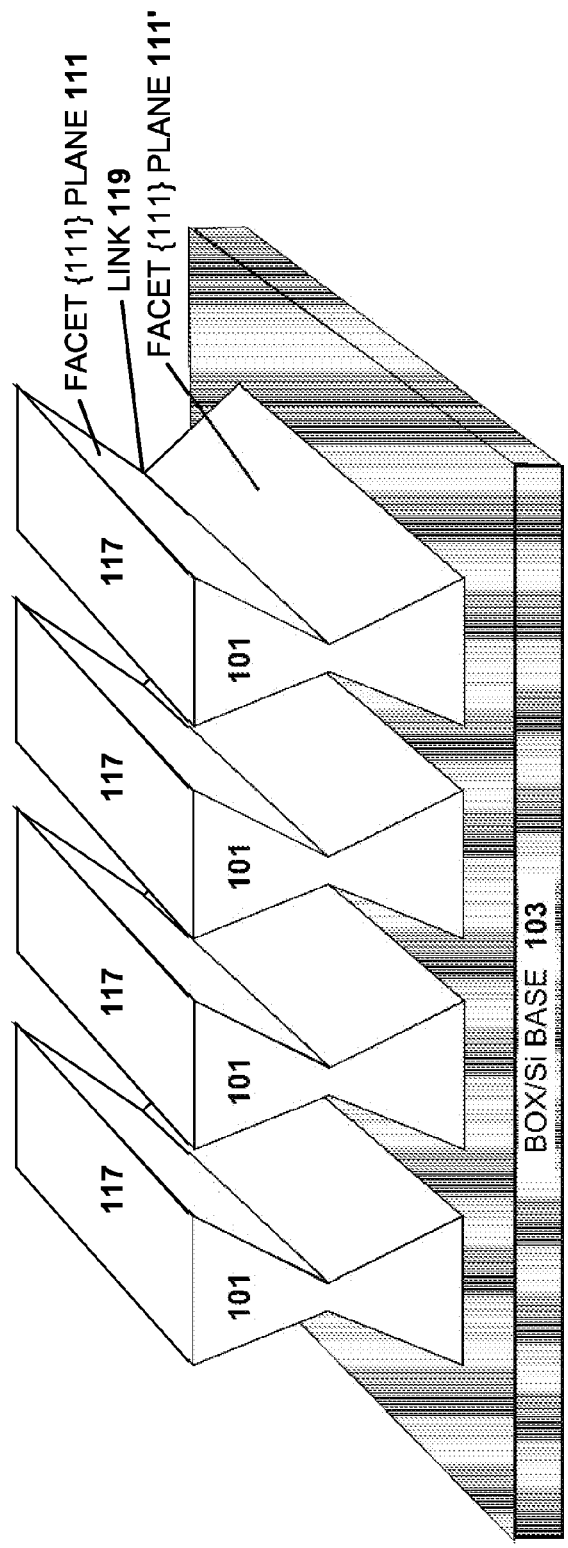
FIG. 5 is a perspective diagram of a structure according to a first embodiment of the invention.

FIG. 5 is a perspective diagram of a structure according to the first embodiment of the invention. In this drawing, the horizontal silicon nitride mask 105 and the vertical silicon nitride masks 107, 109 have been removed by etching or another process. As shown, an array of faceted pillars 101 can be formed with tight pitch as a sidewall image transfer process can be used to form those pillars. As is mentioned above, the SIT process defines features of finer resolution than conventional photolithography. In this embodiment, an array of eFuses is formed, each of which may connect to a respective device, e.g., a finFET transistor. After formation of the array of silicon faceted pillars 101, the array is silicided and then annealed. The silicide process is conventional and well known to the art. Silicide technology is used in the microelectronics industry to form electrical contacts between the semiconductor device and the supporting interconnect structure. The process involves the reaction of a thin metal semiconductor alloy forming metal film with silicon in the active regions of the device, ultimately forming a metal semiconductor alloy contact through a series of annealing and/or etch processes.

The term "metal semiconductor alloy forming metal" is used throughout the present application to denote a metal that can react with an underlying semiconductor material to form a metal semiconductor alloy. Illustrative examples of metal semiconductor alloy forming metals that can be used in the present application include at least one of nickel (Ni), platinum (Pt), palladium (Pd), titanium (Ti), tungsten (W), and cobalt (Co). The metal semiconductor alloy forming metal can be formed by a deposition process including, for example, chemical vapor deposition, plasma enhanced chemical vapor deposition, plating or sputtering. In some embodiments, a co-deposition of metal semiconductor alloy forming metals can be used. In another embodiment, a first metal semiconductor alloy forming metal can be formed, followed by a second metal semiconductor alloy forming metal. The metal semiconductor alloy metal that is formed can have a thickness from 2 to 20 nm. Other thicknesses that are greater than or lesser than the aforementioned thickness range can also be employed as the thickness of the metal semiconductor alloy forming metal. An anneal is performed under conditions that are effective in causing the metal semiconductor alloy forming metal to diffuse into the semiconductor and react with the semiconductor material to provide a metal semiconductor alloy. In one embodiment, the metal semiconductor alloy comprises a metal silicide such as, for example, nickel silicide or platinum-nickel silicide. The metal semiconductor alloy formation anneal may be performed in a single step or a two-step anneal can be used. In one embodiment and when nickel is used, the metal semiconductor alloy formation anneal can be performed at a temperature of from 200° C. to 500° C. In another embodiment, temperatures greater than 500° C. can be used. The metal semiconductor alloy formation anneal is typically performed in an ambient including, for example, argon, helium, neon and/or nitrogen. The metal semiconductor alloy formation anneal can be performed utilizing a rapid thermal anneal, a spike anneal, a microwave anneal or a laser anneal. Following the metal semiconductor alloy formation anneal, any unreacted metal semiconductor alloy forming metal can be removed utilizing one or more etch processes.

After this process, the top faces 117 can serve as anodes and the faces contacting the BOX/Si substrate can serve as cathodes. In other embodiments, surfaces 117 could be cathodes and the faces contacting the BOX/Si substrate are anodes. The narrow link portions 119 serve as the link portions of the eFuse devices.

Electrical fuses (eFuses) are used to in semiconductor industry to implement array redundancy, field programmable arrays, analog component trimming circuits, and chip identification circuits. Programming of the prior art electrical fuses typically takes a substantial amount of current, which is undesirable in current technology node devices using low driving current. In addition, programming transistor takes up space in a semiconductor chip, as well as power consumption.

In the prior art, the conventional fuse link dimension is limited by the allowable photolithographic or SIT minimal dimensions. However, through the present invention, the fuse link dimension can be smaller than the limits of the lithography process used.

In the invention, a self-limiting anisotropic etch is used to form faceted silicon pillar sidewalls so that a narrow link portion can be formed. Such a narrow link portion is difficult to form by a conventional lithography and patterning process.

The faceted structure can be integrated with the conventional finFETs. A finFET is a fin-based, non-planar, multi-gate transistor. While the faceted structure can be integrated with other semiconductor technologies, the finFET processes use many of the similar process steps and materials and as such are deemed particularly suitable.

Figure 6:
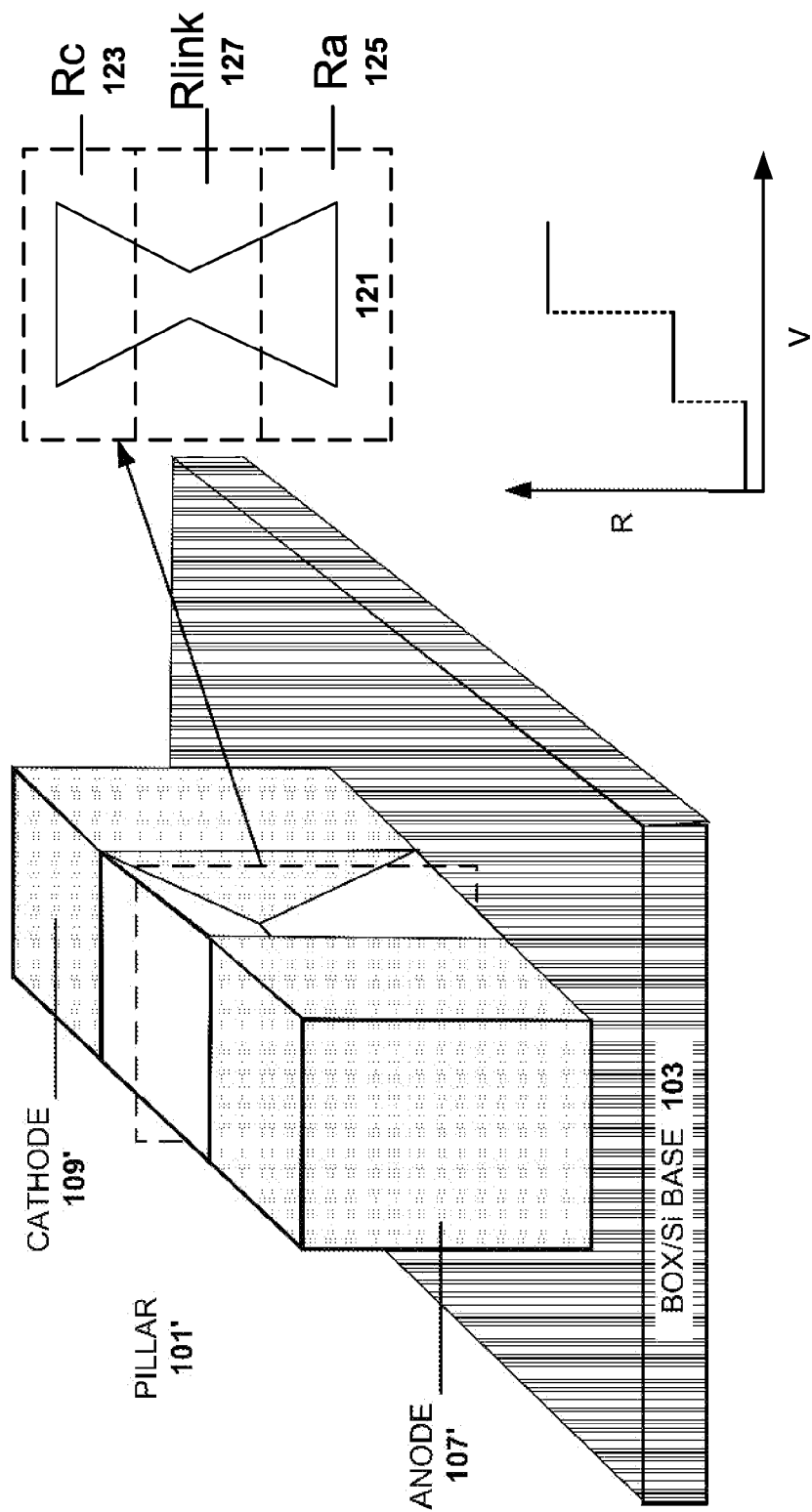
FIG. 6 is a perspective diagram of a structure according to a second embodiment of the invention.

FIG. 6 is a perspective diagram of a structure according to the second embodiment of the invention. In this drawing, an embodiment of the invention is shown to fabricate a combined resistance modulator and eFuse. The process for forming this device is similar to that described above in connection with the first embodiment. Rather than removing the horizontal silicon nitride mask 105 and the vertical silicon nitride masks 107, 109 (shown in FIG. 2) by etching, a chemical mechanical polishing (CMP) process is used. Using CMP, the hardmask 105 is removed completely, while the vertical silicon nitride masks 107, 109 are polished flush with the top of the silicon 101, and later removed. The entire structure can be silicided, thus forming the cathode 109', the anode 107', and resistive link regions 101' of the device from the silicon nitride masks 107, 109 and silicon pillar 101 respectively. In the one preferred embodiment, the nitride mask is removed prior to silidation. The whole pillar will be silicided. The anode, cathode and link material should have similar resistivity, but because of the smaller cross section of the link region the resistance is higher. So the resistance between anode and cathode (the link region) is a three parallel resistor, top Ranode (top portion with larger cross section area, thus lower resistance), bottom Rcathode (same resistance as Ranode), and the Rlink (smaller cross section area, thus higher resistance).

As shown in FIG. 6, a cross-section 121 of the resistive link region is shown. Within the cross-section 121, regions Rc 123, Rlink 125 and Ra 127 are delineated. The resistance of the region can be expressed by the equation:

$$\frac{1}{R} = \frac{1}{Rc} + \frac{1}{Rlink} + \frac{1}{Ra}$$

In a low voltage regime, the resistance of the parallel resistors dominates the overall resistance of the pillar. In a medium voltage regime, the resistance of parallel Rc and Ra resistor dominate. In the medium voltage situation, the thin Rlink region is burnt out. In a high voltage situation, the whole link region is burnt out, thus allowing the device to function as an eFuse.

Figure 7:
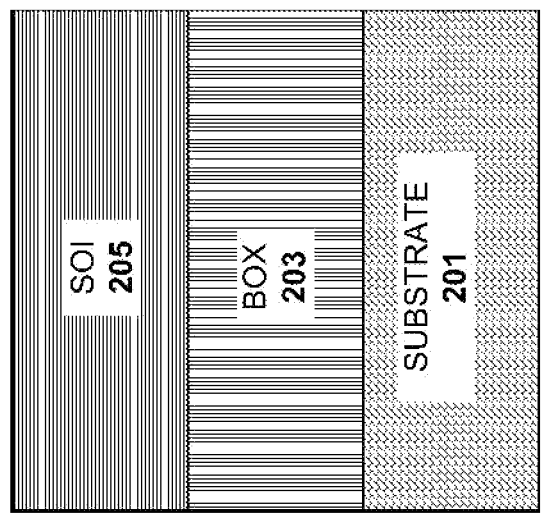
FIG. 7 is a schematic cross-sectional diagram of a structure according to a third embodiment of the invention.

FIG. 7 is a schematic cross-sectional diagram of a structure according to a third embodiment of the invention. In this embodiment, instead of faceted sidewalls, the invention is used to form a faceted top on a planar structure which functions as an eFuse. As shown, the process starts with a semiconductor substrate 201. A buried oxide (BOX) layer 103 is deposited on top of the substrate 201. Then, an SOI layer 107 is deposited on top of the BOX layer 103.

Figure 8:
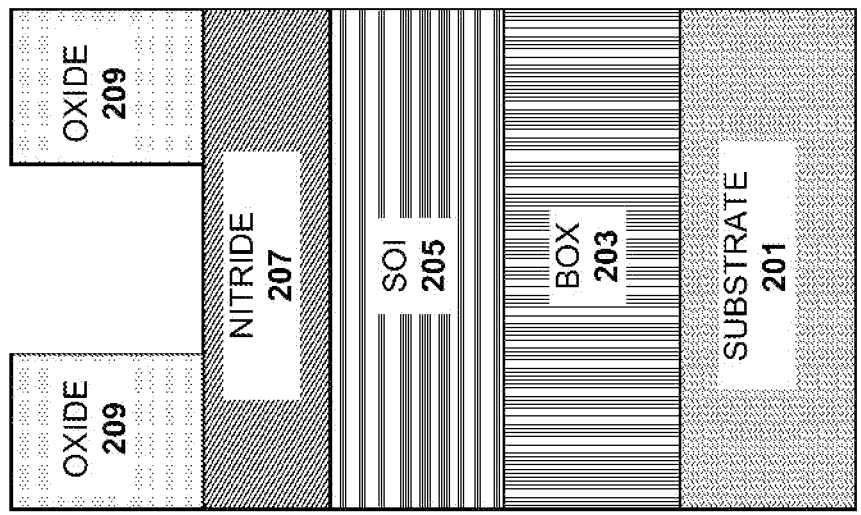
FIG. 8 is a schematic cross-sectional diagram of a structure according to a third embodiment of the invention.

FIG. 8 is a schematic cross-sectional diagram of a structure according to the third embodiment of the invention. As the process continues, on top of the substrate 201, the BOX layer 203 and the SOI layer 205, a hardmask 207 is deposited. In a preferred embodiment of the invention, silicon nitride is used for the hardmask 207. Next, a mandrel layer 209 is formed. In one preferred embodiment of the invention, a silicon oxide pattern is used as the mandrel layer. As is known to the art, a mandrel layer can be used to pattern subsequent layers, e.g., in a SIT process. The mandrel layer 109 can be formed with conventional lithography.

FIGS. 9A-9C are schematic cross-sectional diagrams of the structure according to the third embodiment of the invention as the process continues. First, in FIG. 9A, a spacer 211, 213 are formed using a SIT process. In one preferred embodiment, an amorphous silicon 213 deposition is followed by a Reactive Ion Etch (RIE) step.

Next in FIG. 9B, oxide 215 has been deposited in the spacer gap, followed by chemical mechanical polishing (CMP) to even out the surface. The result is shown in FIG. 9B.

Next as shown in FIG. 9C, the amorphous silicon is etched away, revealing spaces 217 and 219. A new oxide feature 220 is positioned between the original oxide mandrel patterns 209. Thus, using the SIT process, a finer resolution in features can be obtained with conventional lithographic techniques.

Figure 10A:
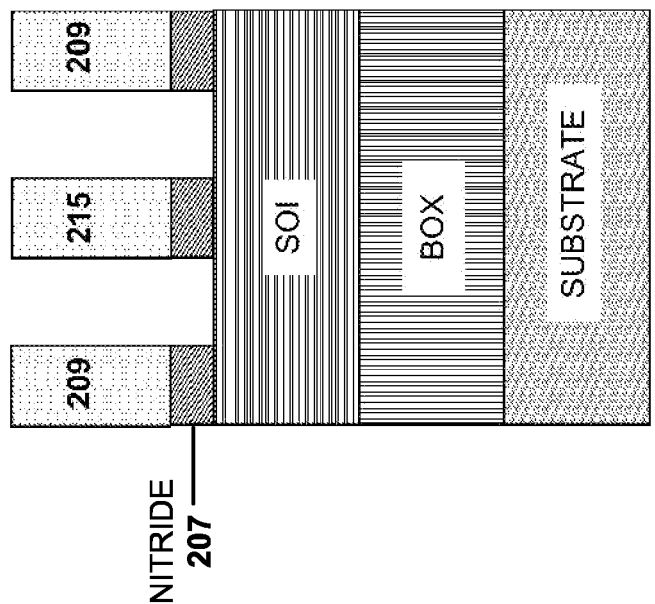
FIGS. 10A-10c are schematic cross-sectional diagrams of a structure according to a third embodiment of the invention.
Figure 10B:
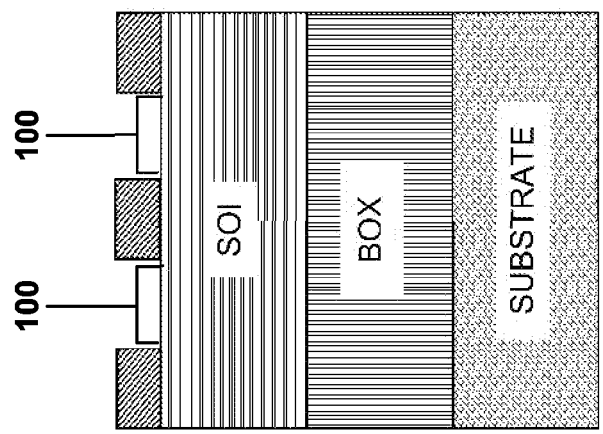
Figure 10C:
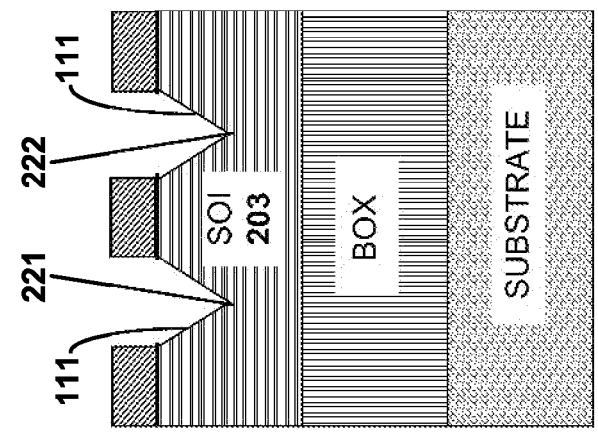

As the process continues, FIGS. 10A-10c are schematic cross-sectional diagrams of an eFuse structure built according to the third embodiment of the invention. As shown in FIG. 10A, the patterned features 209, 215 in the oxide layer serve as a mask. After etching the exposed areas of the nitride layer with an etchant selective to silicon nitride, the process forms a nitride hardmask 207.

In FIG. 10B, the resulting structure is shown after the oxide layer has been removed. In an alternative embodiment of the invention, the oxide layer can be removed later in subsequent process steps. The remaining nitride hardmask 207 is used to pattern the silicon in the (100) plane. In contrast to the prior embodiments, in this embodiment, the silicon feature and openings in the hardmask are disposed horizontally.

Next, as shown in FIG. 10C, a self-limiting etch is performed to etch to form faceted planes 111 in the top face of the SOI layer. As is mentioned above, a TMAH or ammonia etch can be used. Once the facet planes meet at points 221 and 222, the etching effectively stops.

Figure 11:
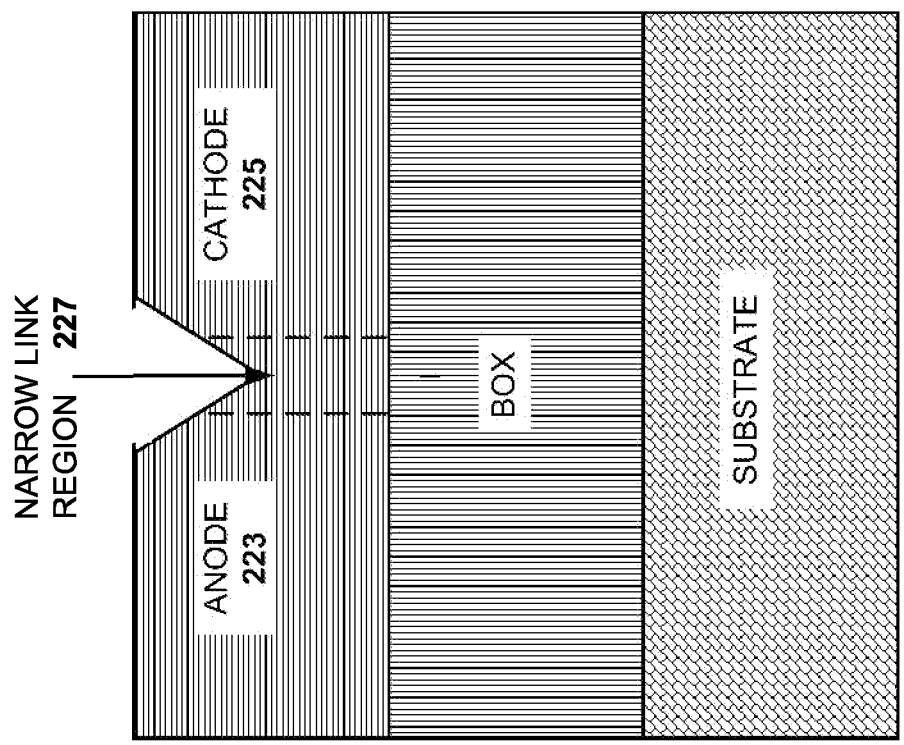
FIG. 11 is a schematic cross-sectional diagram of a structure according to a third embodiment of the invention.

FIG. 11 is a schematic cross-sectional diagram of the planar structure according to the third embodiment of the invention. As in the first and second embodiments, the nitride mask is removed prior to silidation. The silicon feature is silicided with a silicide process similar to that discussed above. As shown, the eFuse has a tall (wide) anode 223 and a tall (wide) cathode 225 and a short (narrow) link 227. The narrow link region 227 has a higher resistivity than anode region 223 and cathode region 225. Once a sufficient voltage is applied, the narrow link region is burnt out, so that the feature can serve as an eFuse.

As would be understood by those ordinarily skilled in the art, the foregoing structures can be formed simultaneously with finFET structures on the same substrate.

In embodiments of the invention, the thickness of the faceted region at the point where the two silicon facet planes meet is a function of a thickness of the silicon layer and a dimension of the mask layer. In the first and second embodiments of the invention, the pillar width W0 is controlled by the width of the hardmask and the thickness of the silicon layer from which the silicon pillars are formed. In the third embodiment of the invention, the thickness is controlled by the spacing of the hardmask and the thickness of the silicon layer. Another way of looking at the relationship is to state that the depth of the faceted area, i.e. the maximum depth of etched silicon is controlled by a dimension of the mask layer, i.e. the distance on the surface of silicon exposed by the mask and point at which the faceted planes touch which is based on the crystalline structure of the silicon. Further, by controlling the orientation of the crystalline structure of the SOI layer, the angles of the silicon planes in the link section of the pillar is controlled, and thus the thickness of the faceted region at the point where the two facet planes meet.

Although the preceding embodiments have used silicon as the representative semiconductor, other semiconductors in the III-V family such as Ge and SiGe can be used so long as they have similar etch characteristics.

The resulting structure can be included within integrated circuit chips, which can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as allows:

1. A method for forming an eFuse device on a substrate used for an integrated circuit, comprising:
    patterning a semiconductor structure from a semiconductor layer deposited over the substrate;
    patterning a mask layer over the semiconductor structure such that a first region of the semiconductor structure is exposed and a second region of the semiconductor structure is protected by the mask layer, wherein the first region is surrounded by the second region;
    forming a link structure of the eFuse device using a self-limiting etch on exposed areas in the first region of the semiconductor structure, wherein the link structure after the self-limiting etch is a first faceted semiconductor structure in the first region, having a first minimum, nonzero thickness at a point where two semiconductor facet planes meet thinner than a second thickness of semiconductor in the second region of the semiconductor structure protected by the mask;
    forming an anode and a cathode of the eFuse device in the second region of the semiconductor structure, the anode, the link structure and cathode being arranged in a plane parallel to the surface of the substrate; and
    converting the link structure into a first faceted metal semiconductor structure using a silicide process.

2. The method as recited in claim 1, wherein the the second region comprises a top surface and two side surfaces of the semiconductor structure on which the mask layer is disposed and the first region is an exposed side surface disposed between the two side surfaces of the second region of the semiconductor structure, the first region is etched by the self-limiting etch, so that a semiconductor pillar with a faceted sidewall is produced from the semiconductor structure and the faceted sidewall is part of the link structure in the eFuse device.

3. The method as recited in claim 2, further comprising performing a silicide process to convert the semiconductor pillar into a metal semiconductor pillar, wherein the metal semiconductor pillar is located on a surface of an insulator layer of a semiconductor-on-insulator substrate and comprises a first metal semiconductor alloy structure having a first thickness, a second metal semiconductor alloy structure of the first thickness, and a metal semiconductor alloy fuse link in the first faceted region located vertically between and connected to first and second metal semiconductor alloy structures and having a second thickness that is less than the first thickness.

4. The method as recited in claim 1, wherein the semiconductor structure wherein the second region is first and second portions of a top surface of the semiconductor structure covered by the mask layer and the first region is a third portion of the top surface exposed by an opening in the mask layer disposed between the first and second portions, so that when the exposed top surface in the first region is etched by the self-limiting etch a faceted region is formed in the exposed top surface with two {111} semiconductor planes which extend laterally from the first and second portions covered by the mask layer and meet in the middle to form a narrow link region used as a link structure in the eFuse device.

5. The method as recited in claim 1, further comprising performing a silicide process to convert the semiconductor structure to a metal semiconductor structure, and wherein the metal semiconductor structure has an anode, a cathode and a narrow link region including the first faceted metal semiconductor structure.

6. The method as recited in claim 1, wherein a thickness of the faceted region at a location that the two semiconductor facet planes meet is a function of a thickness of the semiconductor layer and a dimension of the mask layer.

7. An eFuse device comprising:
    an insulator layer of a semiconductor-on-insulator substrate;
    an anode comprised of a first metal semiconductor alloy structure having a first thickness disposed on the insulator layer;
    a cathode comprised of a second metal semiconductor alloy structure of the first thickness disposed on the insulator layer; and
    a link structure comprised of a faceted metal semiconductor alloy structure disposed on the insulator layer and located between and connected to the first and second metal semiconductor alloy structures and having a second thickness that is less than the first thickness.

8. The device as recited in claim 7, wherein the metal semiconductor alloy link structure is a pillar structure on the surface of the insulator layer.

9. The device as recited in claim 8, further comprising a plurality of pillar structures forming a plurality of eFuse devices on the surface of the insulator layer.

10. The device as recited in claim 9, further comprising a plurality of finFET devices, each finFET device electrically connected to a respective one of the plurality of eFuse devices.

11. The device as recited in claim 8, wherein the device operates in a first voltage mode as a resistance modulator and operates in a second voltage mode as an eFuse.

12. The device as recited in claim 7, wherein the anode, cathode and the metal semiconductor alloy link structure are arranged horizontally to form a planar structure on the surface of the insulator layer and metal semiconductor alloy link structure has a faceted region in a top surface with two {111} semiconductor planes extend laterally from the anode and cathode and meet to form a narrow link region.

13. A method for forming an eFuse device with faceted sidewalls comprising:
 forming a link structure of the eFuse device, wherein the forming of the link structure further comprises:
  forming a semiconductor pillar on a substrate;
  patterning a mask so that central portions of the sidewalls of the semiconductor pillar are exposed while a top surface and end portions of the sidewalls of the semiconductor pillar are covered and protected by the mask;
  performing a self-limiting etch to form a faceted pillar sidewall on a semiconductor pillar sidewall forming a faceted semiconductor pillar;
  removing end portions of the semiconductor pillar; and
  performing silicidation on the faceted semiconductor pillar to form a faceted metal semiconductor pillar, wherein the faceted metal semiconductor pillar comprises the link structure of the eFuse device at a central narrow portion and further comprises one of an anode or a cathode at a top portion and a bottom portion connected by the link structure.

14. The method as recited in claim 13, wherein the top portion of the metal semiconductor pillar is the anode and the bottom portion of the metal semiconductor pillar is the cathode.

15. The method as recited in claim 13, wherein the forming of the silicon pillar is accomplished using a sidewall image transfer process.

16. The method as recited in claim 13, wherein an array of faceted pillars is formed on the substrate forming an array of eFuse devices.

17. The method as recited in claim 13, wherein the self-limiting anisotropic etch substantially stops when two {111} semiconductor planes meet on the faceted sidewall.

18. The method as recited in claim 17, wherein a thickness of the faceted region at a location that the two {111} semiconductor facet planes meet is a function of a thickness of the semiconductor pillar and a dimension of the mask layer.

19. The method as recited in claim 13, wherein the self-limiting etch is a tetramethyl ammonium hydroxide etch.

20. An eFuse device comprising:
 a metal semiconductor pillar located on a surface of a substrate, the metal semiconductor pillar comprising:
  an anode comprised of a metal semiconductor located in first one of the top portion or bottom portion of the metal semiconductor pillar having a first thickness;
  a cathode comprised of a metal semiconductor located in a second one of the top portion or bottom portion of the metal semiconductor pillar having the first thickness; and
  a faceted link structure comprised of the metal semiconductor alloy structure located between and connecting the anode and cathode and having a second thickness that is less than the first thickness.

* * * * *